United States Patent
Wang et al.

(10) Patent No.: US 12,456,860 B2
(45) Date of Patent: Oct. 28, 2025

(54) CLAMP CIRCUIT

(71) Applicant: Ancora Semiconductors Inc., Taoyuan (TW)

(72) Inventors: Hong-Sheng Wang, Taoyuan (TW); Chang-Jing Yang, Taoyuan (TW); Wei-Hsiang Chao, Taoyuan (TW); Ying-Chen Liu, Taoyuan (TW)

(73) Assignee: ANCORA SEMICONDUCTORS INC., Taoyuan (TW)

( * ) Notice: Subject to any disclaimer, the term of this patent is extended or adjusted under 35 U.S.C. 154(b) by 146 days.

(21) Appl. No.: 18/524,962

(22) Filed: Nov. 30, 2023

(65) Prior Publication Data
US 2025/0183657 A1    Jun. 5, 2025

(51) Int. Cl.
*H02H 9/04* (2006.01)

(52) U.S. Cl.
CPC .................... *H02H 9/046* (2013.01)

(58) Field of Classification Search
CPC ........... H02H 9/046; H02H 9/04; H02M 1/32; H02M 1/0038
USPC ........................................................ 361/56
See application file for complete search history.

(56) References Cited

U.S. PATENT DOCUMENTS

| | | | |
|---|---|---|---|
| 8,072,721 B2 * | 12/2011 | Kwong | H03K 19/018557 361/56 |
| 10,177,135 B2 * | 1/2019 | Huang | H10D 89/811 |
| 10,224,817 B1 | 3/2019 | Sharma et al. | |
| 2015/0318275 A1 * | 11/2015 | Chen | H10D 89/811 361/56 |
| 2021/0210955 A1 * | 7/2021 | Jiang | H10D 89/811 |
| 2022/0376494 A1 * | 11/2022 | Guan | H10D 89/811 |
| 2023/0170882 A1 | 6/2023 | Shah et al. | |
| 2023/0275073 A1 * | 8/2023 | Kuo | H01L 23/62 361/91.6 |
| 2024/0178830 A1 * | 5/2024 | Leong | H10D 89/611 |
| 2025/0063824 A1 * | 2/2025 | Huang | H10D 89/60 |

FOREIGN PATENT DOCUMENTS

| | | | | |
|---|---|---|---|---|
| CN | 101800424 A | * | 8/2010 | ....... H03K 19/00315 |
| CN | 116266698 A | * | 6/2023 | ........... H10D 89/911 |
| TW | 202109771 A | | 3/2021 | |
| WO | WO-2019066871 A1 | * | 4/2019 | ......... H10D 62/8503 |

* cited by examiner

*Primary Examiner* — Dharti H Patel
(74) *Attorney, Agent, or Firm* — MUNCY, GEISSLER, OLDS & LOWE, P.C.

(57) ABSTRACT

A clamp circuit is provided. The clamp circuit includes a major Gallium Nitride (GaN) transistor, a miller GaN transistor, and a capacitor circuit. The major GaN transistor (10) includes a major gate, a major drain, and a major source coupled to a first node. The miller GaN transistor includes a miller gate coupled to a second node, a miller drain coupled to the major gate, and a miller source coupled to the first node. The capacitor circuit is coupled between the major drain and the second node.

20 Claims, 6 Drawing Sheets

CLAMP CIRCUIT

BACKGROUND OF THE INVENTION

Field of the Invention

The invention relates to a clamp circuit, and more particularly, to an active Miller clamp circuit with protection mechanism.

Description of the Related Art

Generally, a bridge-type driver comprises a transistor in the upper half-bridge and a transistor in the lower half-bridge. In a normal operation, these two transistors are not turned on at the same time. However, in the case where one of the two transistors is turned on and the other one thereof is turned off, when the turned-off transistor is instantaneously subjected to a large voltage generated by the turned-on transistor (that is, when the turned-off transistor is subjected to a high dV/dt induced by the turned-on transistor), there is a miller spike is induced at the gate of the turned-off transistor through the gate-drain parasitic capacitor of the turned-off transistor, which may erroneously turn on the transistor that should be at the turned-off state.

BRIEF SUMMARY OF THE INVENTION

One exemplary embodiment of a clamp circuit is provided. The clamp circuit comprises a major Gallium Nitride (GaN) transistor, a miller GaN transistor, and a capacitor circuit. The major GaN transistor (10) comprises a major gate, a major drain, and a major source coupled to a first node. The miller GaN transistor comprises a miller gate coupled to a second node, a miller drain coupled to the major gate, and a miller source coupled to the first node. The capacitor circuit is coupled between the major drain and the second node.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
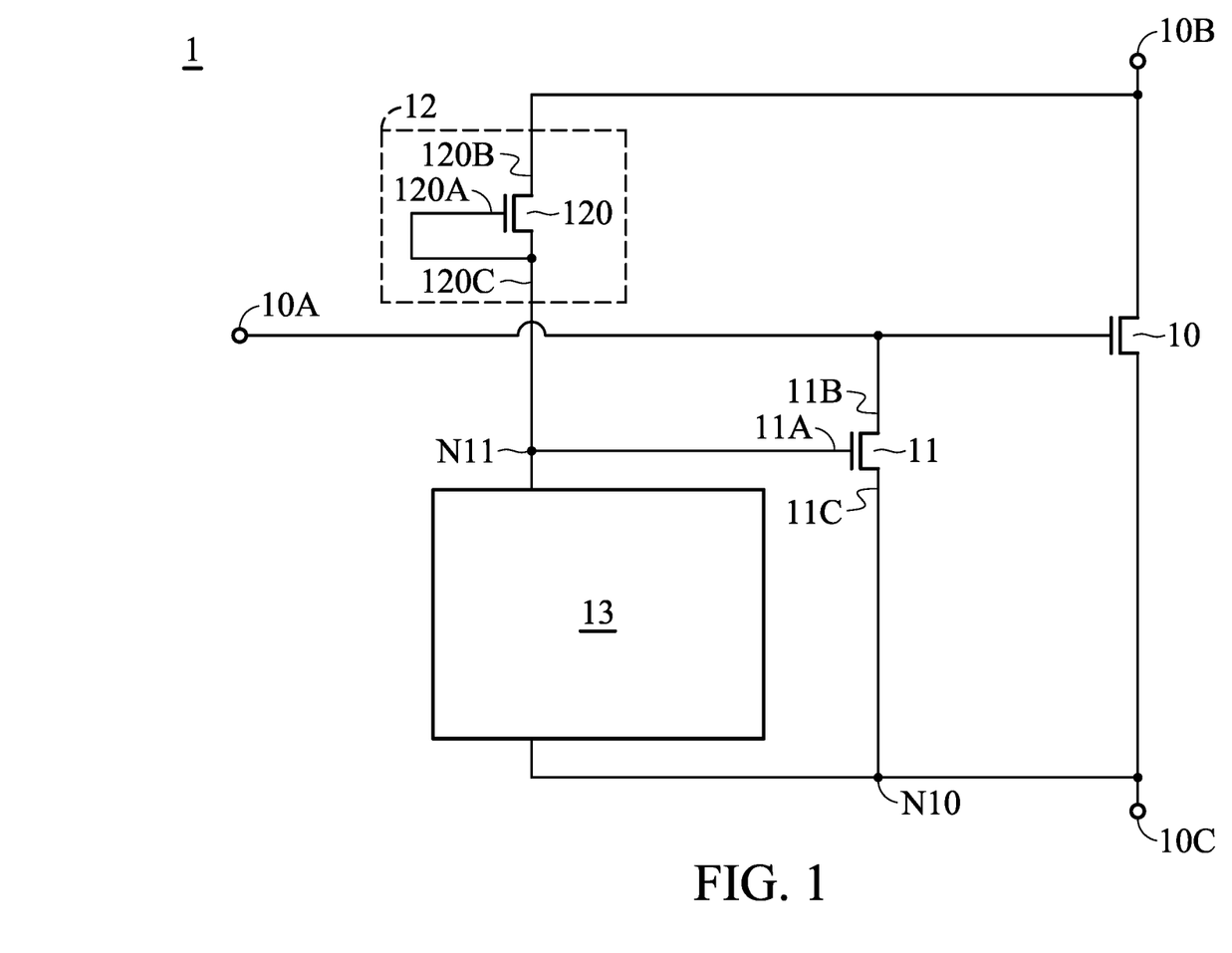
FIG. 1 shows one exemplary embodiment of a clamp circuit.

FIG. 1 shows one exemplary embodiment of a clamp circuit. Referring to FIG. 1, a clamp circuit 1 comprises a major Gallium Nitride (GaN) transistor, a miller GaN transistor 11, a capacitor circuit 12, and a protection circuit 13. In the embodiment, the major GaN transistor 10 and the miller GaN transistor 11 are N-type transistors. The major GaN transistor 10 comprises a major gate 10A, a major drain 10B, and a major source 10C, and the miller GaN transistor 11 comprises a miller gate 11A, a miller drain 11B, and a miller source 11C. The major source 10C of the major GaN transistor 10 is coupled to a first node N10 that is coupled to a relatively low potential or a ground. The miller gate 11A of the miller GnN transistor 11 is coupled to a second node N11, the miller drain 11B thereof is coupled to the major gate 10A of the major GaN transistor 10, and the miller source 11C thereof is coupled to the first node N10.

The capacitor circuit 12 is coupled between the major drain 10B of the major GaN transistor 10 and the second node N11 for providing a capacitance. In an embodiment, as shown in FIG. 1, the capacitor circuit 12 comprises a GaN transistor 120. In the embodiment, the GaN transistor 120 is an N-type transistor. The GaN transistor 120 comprises a capacitive gate 120A, a capacitive drain 120B, and a capacitive source 120C. The capacitive source 120C of the GaN transistor 120 is coupled to the second node N11, the capacitive gate 120A thereof is coupled to the capacitive source 120C, and the capacitive drain 120B thereof is coupled to the major drain 10B of the major GaN transistor 10. Based on the connection structure of the GaN transistor 120, the GaN transistor 120 is provided as a capacitor.

The protection circuit 13 is coupled between the second node N11 and the first node N10. The protection circuit 13 operates to provide protections for the miller GaN transistor 11 by controlling or determining the voltage at the second node N11 (that is, the voltage at the miller gate 11A of the miller GaN transistor 11), which prevents the miller GaN transistor 11 from being damaged by a large voltage occurring at the second node N11.

The operation of the clamp circuit 1 will be described in the following paragraphs.

Based on the structure of the clamp circuit 1, when a voltage is provided to the major drain 10B of the miller GaN transistor 11, the voltage at the second node N11 is determined by the voltage at the major drain 10B, the capacitor circuit 12, and the parasitic capacitor formed by the miller gate 11A and the miller source 11C of the miller GaN transistor 11, in details, the voltage at the second node N11 is determined by the voltage at the major drain 10B and the ratio between the capacitance value of the capacitor circuit 12 (providing a capacitance value) and the capacitance value of the gate-source capacitor of the miller GaN transistor 11.

In cases where the major GaN transistor 10 is turned off (turned-off state), when the voltage of the major drain 10B of the miller GaN transistor 11 becomes larger instantaneously, the voltage at the second node N11 increases to a relatively high level based on the ratio between the capacitance value of the capacitor circuit 12 and the capacitance value of the gate-source capacitor of the miller GaN transistor 11 to turn on the miller GaN transistor 11. Accordingly, there is a discharge path formed between the major gate 10A and the first node N10 through the turned-on miller GaN transistor 11 so that the charges at the major gate 10A are conducted to the major source 10C through the discharge path, which keeps the turned-off state of the major GaN transistor 10. According to the embodiment, the miller spike at the major gate 10A that may be induced through the parasitic capacitor between the major gate 10A and the major drain 10B of the major GaN transistor 10 when a large voltage is provided to the major drain 10B can be eliminated, which prevents abnormal operation of the major GaN transistor 10.

Figure 2:
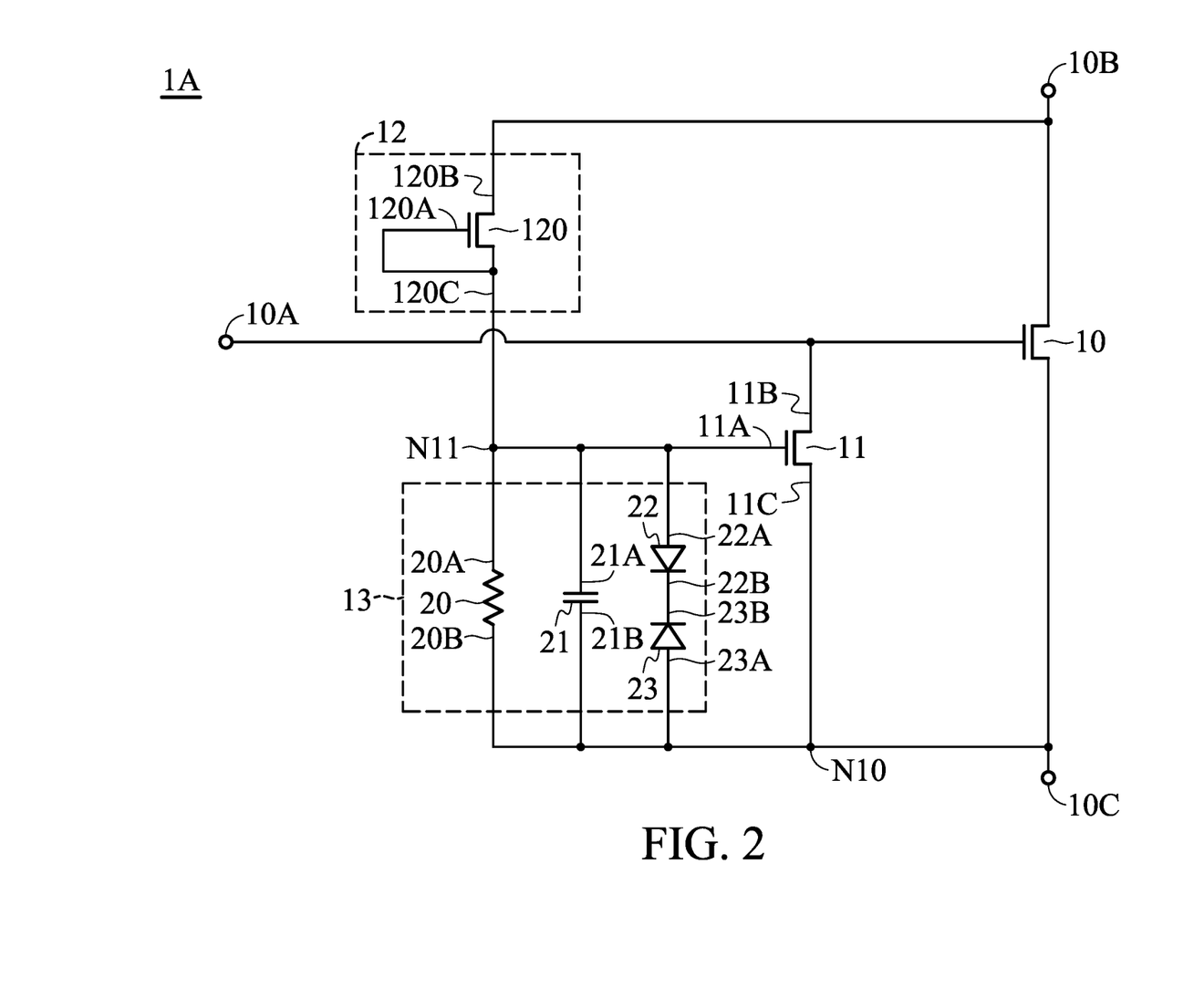
FIG. 2 shows another exemplary embodiment of a clamp circuit.

The present application provided different embodiments for the protection circuit. Referring to FIG. 2, in a clamp circuit 1A, the protection circuit 13 comprises a resistor 20, a capacitor 21, and diodes 22 and 23. The resistor 20 comprises a first terminal 20A and a second terminal 20B. The first terminal 20A of the resistor 20 is coupled to the second node N11, and the second terminal 20B thereof is coupled to the first node N10. The capacitor 21 comprises a first terminal 21A and a second terminal 21B. The first terminal 21A of the capacitor 21 is coupled to the second node N11, and the second terminal 21B thereof is coupled to the first node N10. The anode 22A of the diode 22 is coupled to the second node N11, the cathode 22B of the diode 22 is coupled to the cathode 23B of the diode 23, and the anode 23A of the diode 22 is coupled to the first node N10. In the clamp circuit 1A, the operation, structure, and connection of the major GaN transistor 10 and the miller GaN transistor 11 and the capacitor circuit 12 are similar to those described in the embodiment of FIG. 1, and the related description is omitted here.

Referring to FIG. 2, the resistor 20 is coupled between the second node N11 and the first node N10. The resistor 20 provides a discharge path for the second node N11. After the voltage at the second node N11 increases with the voltage at the major drain 10B based on the ratio between the capacitance value of the capacitor circuit 12 and the capacitance value of the gate-source capacitor of the miller GaN transistor 11, the charges at the second node N11 (that is, the miller gate 11A) are conducted to the major source 10C through the resistor 20. The discharge speed for the charges at the second node N11 is determined by the resistance value of the resistor 20.

The capacitor 21 is provided a capacitance value to supplement the capacitance value of the gate-source capacitor of the miller GaN transistor 11. When the capacitance value of the gate-source capacitor of the miller GaN transistor 11 is suitable for obtaining a determined ratio between the capacitance value of the capacitor circuit 12 and the capacitance value of the gate-source capacitor of the miller GaN transistor 11, the capacitor 21 can be removed.

The diodes 22 and 23 are coupled together in a reverse direction between the second node N11 and the first node N10, thereby presents the voltage at the second node N11 from being affected by a large voltage at the first node N10. Thus, the miller GaN transistor 11 may not be damaged by a large voltage at the first node N10.

Figure 3:
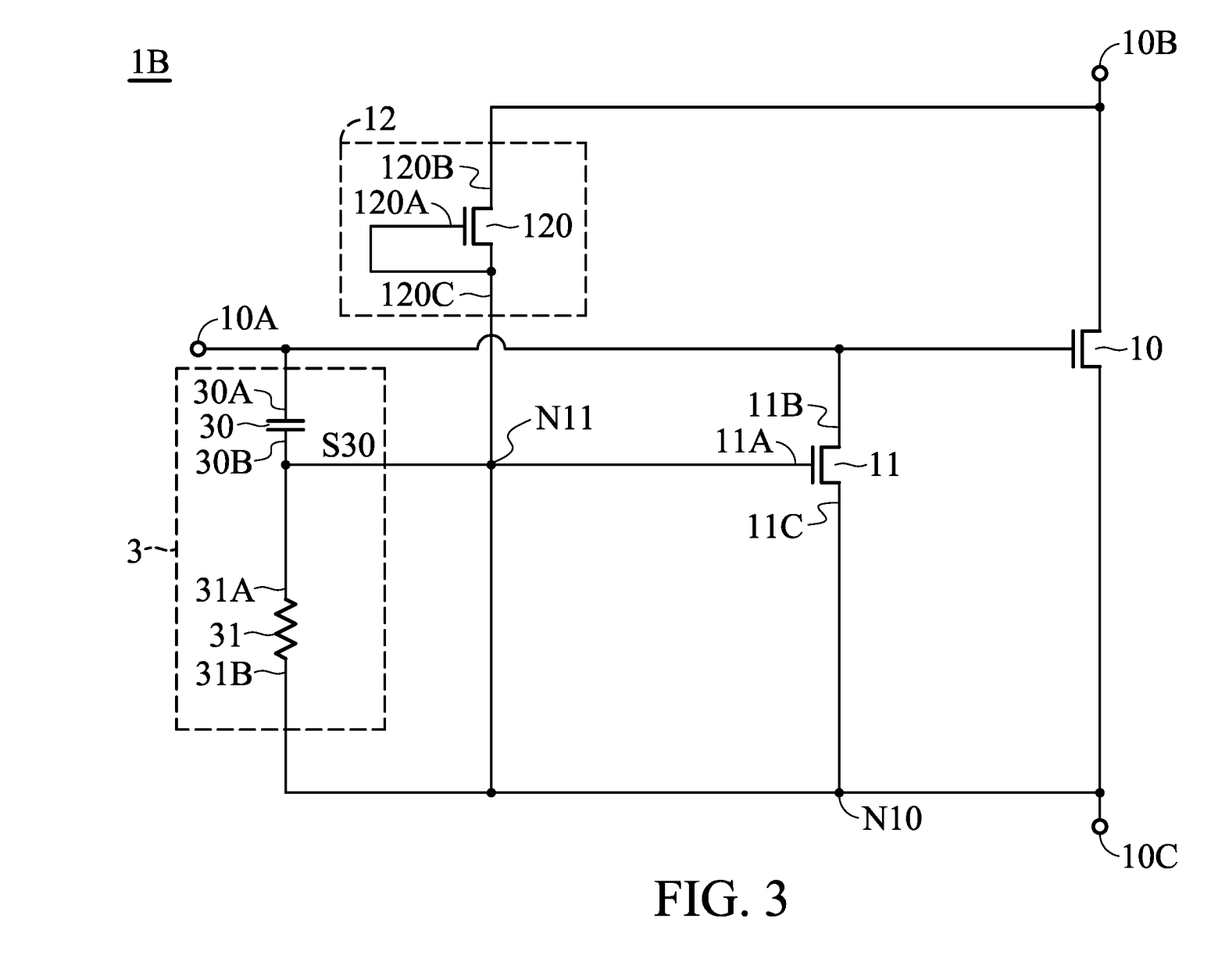
FIG. 3 shows another exemplary embodiment of a clamp circuit.

FIG. 3 shows another exemplary embodiment of a clamp circuit. Referring to FIG. 3, a clamp circuit 1B comprises a detection circuit 3, but does not comprise the protection circuit 13 shown in FIGS. 1 and 2. In the clamp circuit 1B, the operation, structure, and connection of the major GaN transistor 10 and the miller GaN transistor 11 and the capacitor circuit 12 are similar to those described in the embodiments of FIGS. 1 and 2, and the related description is omitted here. As shown in FIG. 3, the detection circuit 3 is coupled between the major gate 10A of the major GaN transistor 10 and the first node N10. The detection circuit 3 detects whether an electrostatic discharge (ESD) event occurs at the major gate 10A to generate a detection signal S10. When the detection circuit 3 detects that an ESD event occurs at the major gate 10A, the miller GaN transistor 11 is turned on according to the detection signal S10 to provide a discharge path the major gate 10A and the first node N10.

Referring to FIG. 3, the detection circuit 3 comprises a capacitor 30 and a resistor 31. The capacitor 30 comprises a first terminal 30A and a second terminal 30B. The first terminal 30A of the capacitor 30 is coupled to the major gate 10A, and the second terminal 30B thereof is coupled to the second node N11. The resistor 31 comprises a first terminal 31A and a second terminal 31B. The first terminal 31A of the resistor 31 is coupled to the second node N11, and the second terminal 31B thereof is coupled to the first node N10.

When an ESD event occurs at the major gate 10A, the voltage at the major gate 10A instantaneously increases in response to the ESD event. At this time, based on the element characteristics of the capacitor 30, the detection signal S10 at the second node N11 has a relatively high voltage level in response to the increased voltage at the major gate 10A, that is, the second node N11 has a relatively high voltage. The relatively high voltage at the second node N11 turns on the miller GaN transistor 11 to provide a discharge path between the major gate 10A and the first node N10, so that the electrostatic charges at the major gate 10A are conducted to the first node N10 through the discharge path. Accordingly, the major GaN transistor 10 cannot be damaged by the ESD event. According to the above operation, the miller GaN transistor 11, the capacitor 30, and the resistor 31 form an ESD protection circuit.

Figure 4:
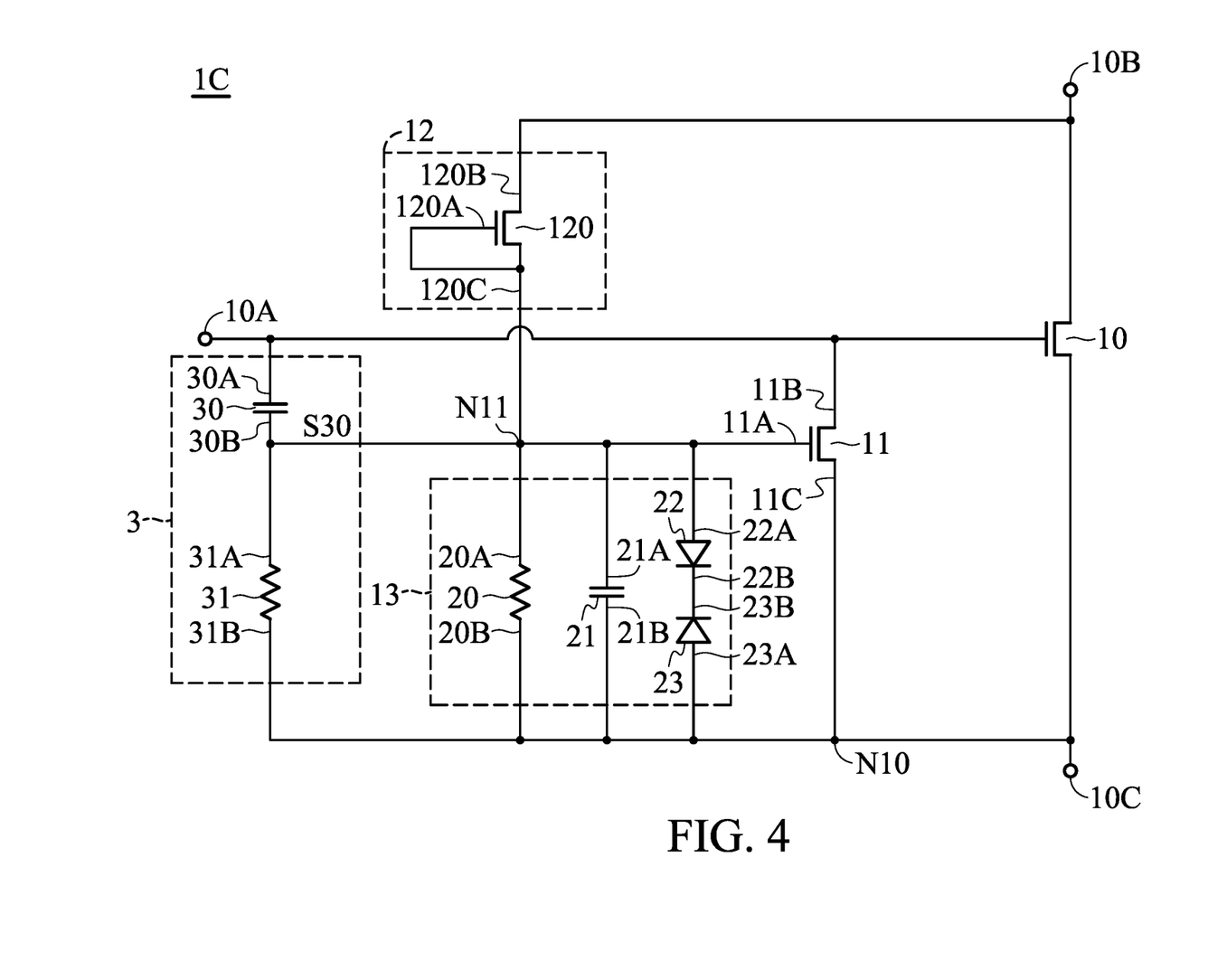
FIG. 4 shows another exemplary embodiment of a clamp circuit.

FIG. 4 shows another exemplary embodiment of a clamp circuit. Referring to FIG. 4, a clamp circuit 1C comprises the protection circuit 13 shown in FIGS. 1 and 2 and the detection circuit 3 shown in FIG. 3. In the clamp circuit 1C, the operation, structure, and connection of the major GaN transistor 10 and the miller GaN transistor 11, the capacitor circuit 12, the protection circuit 13, and the detection circuit 3 are similar to those described in the embodiments of FIGS. 1-3, and the related description is omitted here. Based on the circuit structure shown in FIG. 4, the clamp circuit 1C is provided with protections (including an ESD protection) for the major GaN transistor 10 and further with the protections for the miller GaN transistor 11.

Figure 5:
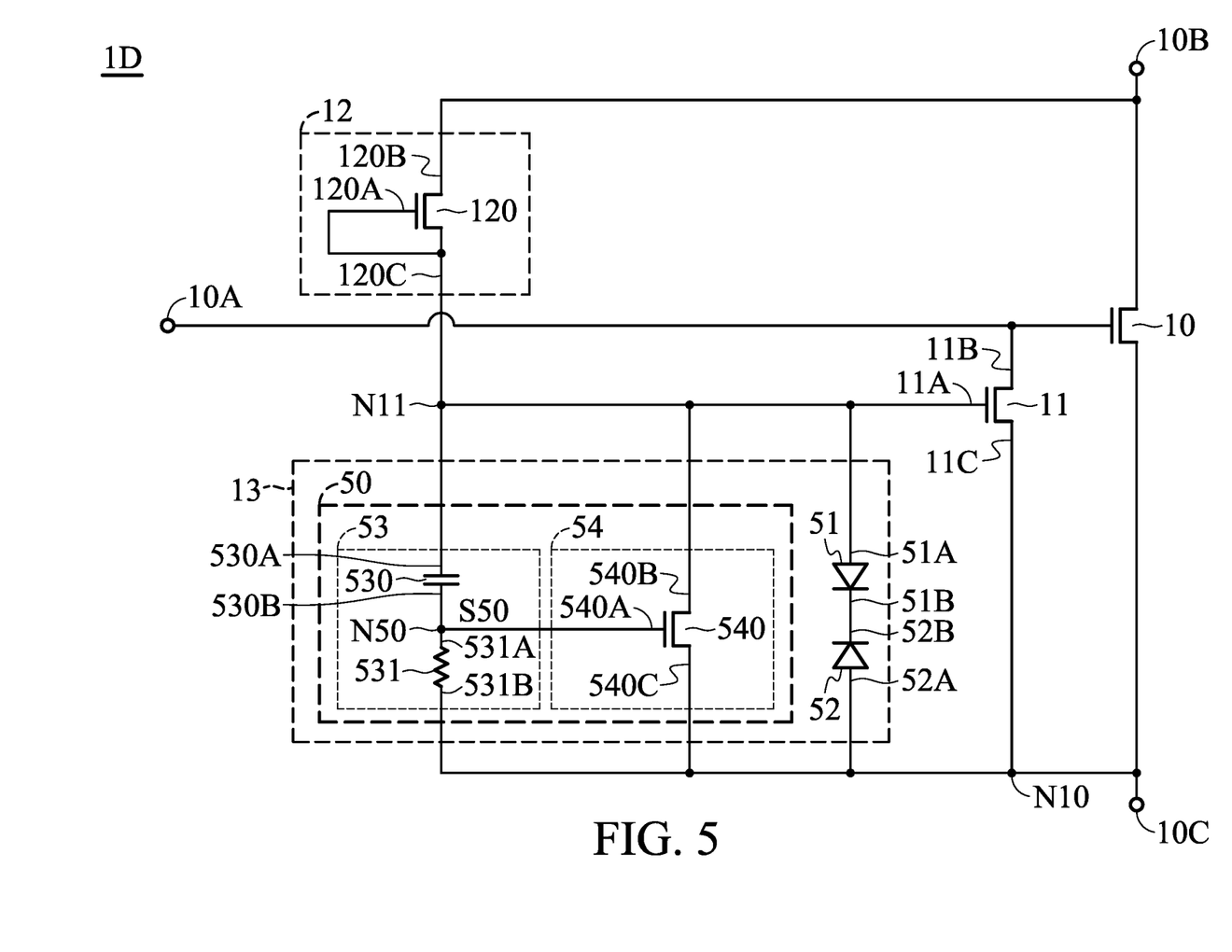
FIG. 5 shows another exemplary embodiment of a clamp circuit.

Another embodiment of the protection circuit 13 is shown in FIG. 5. Referring to FIG. 5, the protection circuit 13 comprises an ESD protection circuit 50 and diodes 51 and 52. The ESD protection circuit 50 is coupled between the second node N11 and the first node N10. The anode 51A of the diode 51 is coupled to the second node N11, the cathode 51B of the diode 51 is coupled to the cathode 52B of the diode 52, and the anode 52A of the diode 52 is coupled to the first node N10. In the clamp circuit 1D, the operation, structure, and connection of the major GaN transistor 10 and the miller GaN transistor 11 and the capacitor circuit 12 are similar to those described in the embodiment of FIG. 1, and the related description is omitted here.

Referring to FIG. 5, the diodes 51 and 52 are coupled together in a reverse direction between the second node N11 and the first node N10, thereby presents the voltage at the second node N11 from being affected by a large voltage at the first node N10. Thus, the miller GaN transistor 11 may not be damaged by a large voltage at the first node N10.

The ESD protection circuit 50 operates to provide a discharge path between the second node N11 and the first node N10 when an ESD event occurs at the second node N11 (that is, the miller gate 11A of the miller GaN transistor 11). Referring to FIG. 5, the ESD protection circuit 50 comprises a detection circuit 53 and a discharge circuit 54. The detection circuit 53 is coupled between the second node N11 and the first node N10. The detection circuit 53 detects whether an ESD event occurs at the second node N11 or at the major drain 10B to generate a detection signal S50. When the detection circuit 53 detects that an ESD event occurs at the second node N11 or at the major drain 10B, the discharge circuit 54 is enabled according to the detection signal S50 to provide a discharge path between the second node N11 and the first node N10.

Referring to FIG. 5, the detection circuit 53 comprises a capacitor 530 and a resistor 531. The capacitor 530 comprises a first terminal 530A and a second terminal 530B. The first terminal 530A of the capacitor 530 is coupled to the second node N11, and the second terminal 530B thereof is coupled to a third node N50. The resistor 531 comprises a first terminal 531A and a second terminal 531B. The first terminal 531A of the resistor 531 is coupled to the third node N50, and the second terminal 531B thereof is coupled to the first node N10. The discharge circuit 54 comprises a first transistor 540. In the embodiment, the first transistor is implemented by a GaN transistor. The first transistor 540 is an N-type transistor. The first transistor 540 comprises a first gate 540A, a first drain 540B, and a first source 540C. The first gate 540A of the first transistor 540 is coupled to the third node N50 between the capacitor 530 and the resistor 531, the first drain 540B thereof is coupled to the second node N11, and the first source 540C thereof is coupled to the first node N10.

When an ESD event occurs at the second node N11 or at the major drain 10B, the voltage at the second node N11 instantaneously increases in response to the ESD event at the second node N11 or in response to the ESD event at the major drain 10B based on the element characteristics of the capacitor circuit 12. At this time, based on the element characteristics of the capacitor 530, the detection signal S50 at the third node N50 has a relatively high voltage level in response to the increased voltage at the second node N11, that is, the node N50 has a relatively high voltage. The relatively high voltage at the third node N50 turns on the first transistor 540 to provide a discharge path between the second nodes N11 and the first node N10, so that the electrostatic charges at the second node N11 are conducted to the first node N10 through the discharge path. Accordingly, the first transistor 540 cannot be damaged by the ESD event.

Figure 6:
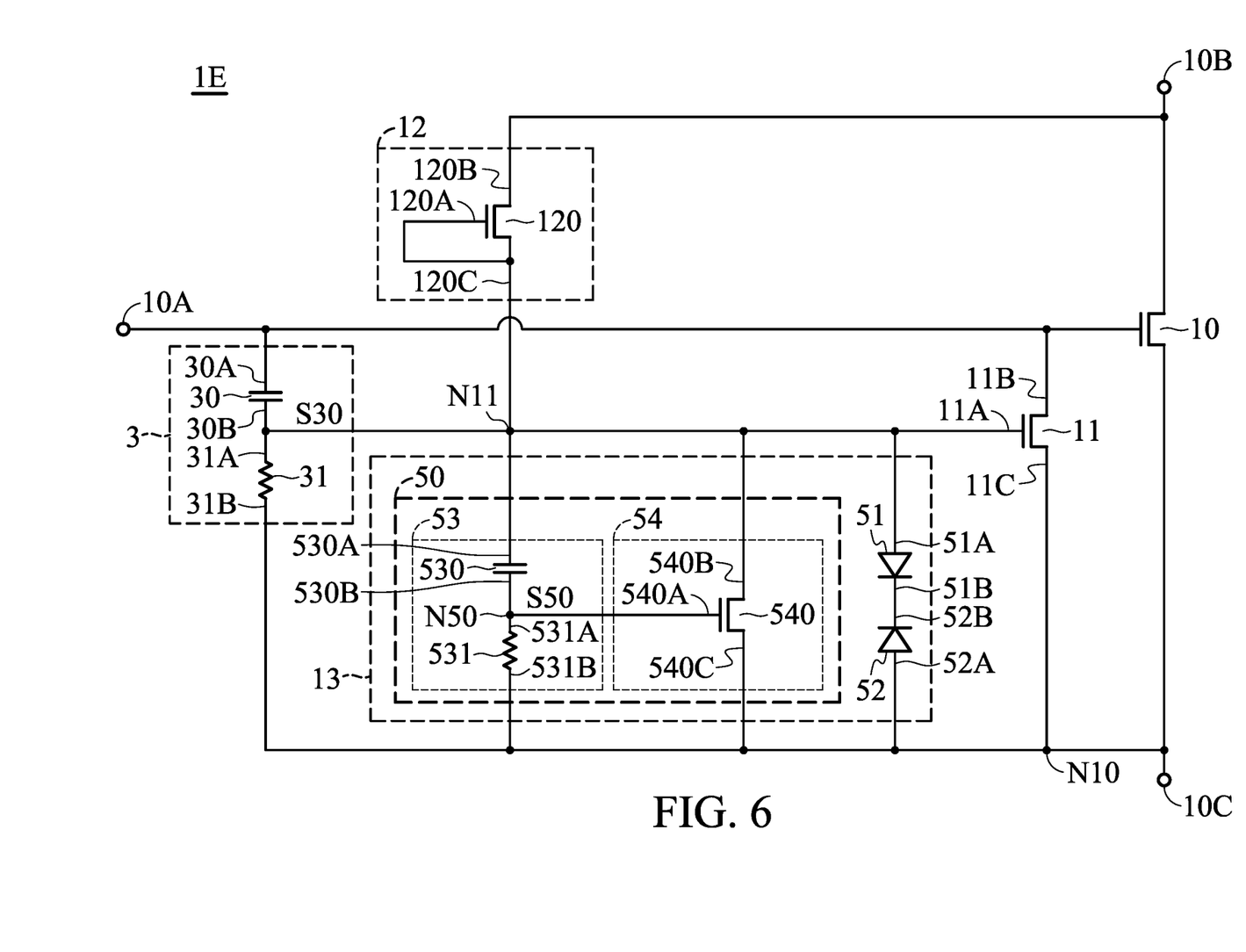
FIG. 6 shows another exemplary embodiment of a clamp circuit.

FIG. 6 shows another exemplary embodiment of a clamp circuit. Referring to FIG. 6, a clamp circuit 1E comprises the protection circuit 13 shown in FIG. 5 and the detection circuit 3 shown in FIG. 3. In the clamp circuit 1E, the operation, structure, and connection of the major GaN transistor 10 and the miller GaN transistor 11, the capacitor circuit 12, the protection circuit 13, and the detection circuit 3 are similar to those described in the embodiments of FIGS. 3 and 5, and the related description is omitted here. Based on the circuit structure shown in FIG. 6, the clamp circuit 1E is provided with protections (including an ESD protection) for the major GaN transistor 10 and further with the protections (including an ESD protection).

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clamp circuit comprising:
    a major Gallium Nitride (GaN) transistor comprising a major gate, a major drain, and a major source coupled to a first node;
    a miller GaN transistor comprising a miller gate coupled to a second node, a miller drain coupled to the major gate, and a miller source coupled to the first node;
    a capacitor circuit coupled between the major drain and the second node; and
    a protection circuit coupled between the second node and the first node, wherein the protection circuit comprises:
        a first resistor comprising a first terminal coupled to the second node and a second terminal coupled to the first node;
        a first capacitor comprising a first terminal coupled to the second node and a second terminal coupled to the first node;
        a first diode comprising a first anode coupled to the second node and a first cathode; and
        a second diode comprising a second anode coupled to the first node and a second cathode coupled to the first cathode.

2. The clamp circuit as claimed in claim 1, wherein the capacitor circuit comprises:
    a capacitive GaN transistor comprising a capacitive source coupled to the second node, a capacitive gate coupled to the capacitive source, and a capacitive drain coupled to the major drain.

3. The clamp circuit as claimed in claim 1, further comprising:
    a detection circuit coupled between the major gate of the major GaN transistor and the first node,
    wherein the detection circuit detects whether an electrostatic discharge (ESD) event occurs at the major gate to generate a detection signal, and
    wherein in response to the detection circuit detecting that the ESD event occurs at the major gate, the miller GaN transistor is turned on according to the detection signal.

4. The clamp circuit as claimed in claim 3, wherein the detection circuit comprises:
    a second capacitor comprising a first terminal coupled to the first major and a second terminal coupled to the second node; and
    a second resistor comprising a first terminal coupled to the second node and a second terminal coupled to the first node,
    wherein the detection signal is generated at the second node.

5. The clamp circuit as claimed in claim 1, wherein the protection circuit comprises:
    an electrostatic discharge (ESD) protection circuit, coupled between the second node and the first node,
    wherein in response to a first ESD event occurring at the second node or at the major drain, the ESD protection circuit provides a discharge path between the second node and the first node.

6. The clamp circuit as claimed in claim 5, wherein the ESD protection circuit comprises:
    a detection circuit coupled between the second node and the first node, wherein the detection circuit detects whether the first ESD event occurs at the second node or at the major drain to generate a detection signal; and
    a discharge circuit receiving the detection signal,
    wherein in response to the detection circuit detecting that the first ESD event occurs at the second node or at the major drain, the discharge circuit provides a discharge path between the second node and the first node according to the detection signal.

7. The clamp circuit as claimed in claim 6, wherein the detection circuit comprises:
a second capacitor comprising a first terminal coupled to the second node and a second terminal coupled to a third node; and
a second resistor comprising a first terminal coupled to the third node and a second terminal coupled to the first node.

8. The clamp circuit as claimed in claim 6, wherein the discharge circuit comprises:
a first transistor comprising a first gate coupled to the detection circuit to receive the detection signal, a first drain coupled to the second node, and a first source coupled to the first node,
wherein in response to the detection circuit detecting that the first ESD event occurs at the second node or at the major drain, the detection circuit generates the detection signal at the third node, and the transistor is turned on according to the detection signal.

9. The clamp circuit as claimed in claim 8, wherein the first transistor is implemented by a GaN transistor.

10. The clamp circuit as claimed in claim 5, further comprising:
a detection circuit coupled between the major gate of the first major GaN transistor and the first node,
wherein the detection circuit detects whether a second ESD event occurs at the major gate to generate a detection signal, and
wherein in response to the detection circuit detecting that the second ESD event occurs at the major gate, the miller GaN transistor is turned on according to the detection signal.

11. The clamp circuit as claimed in claim 10, wherein the detection circuit comprises:
a second capacitor comprising a first terminal coupled to the major gate and a second terminal coupled to the second node; and
a second resistor comprising a first terminal coupled to the second node and a second terminal coupled to the first node,
wherein the detection signal is generated at the second node.

12. A clamp circuit comprising:
a major Gallium Nitride (GaN) transistor comprising a major gate, a major drain, and a major source coupled to a first node;
a miller GaN transistor comprising a miller gate coupled to a second node, a miller drain coupled to the major gate, and a miller source coupled to the first node;
a capacitor circuit coupled between the major drain and the second node; and
a first detection circuit coupled between the major gate of the major GaN transistor and the first node,
wherein the first detection circuit detects whether an electrostatic discharge (ESD) event occurs at the major gate to generate a first detection signal, and
wherein in response to the first detection circuit detecting that the ESD event occurs at the major gate, the miller GaN transistor is turned on according to first the detection signal.

13. The clamp circuit as claimed in claim 12, wherein the capacitor circuit comprises:
a capacitive GaN transistor comprising a capacitive source coupled to the second node, a capacitive gate coupled to the capacitive source, and a capacitive drain coupled to the major drain.

14. The clamp circuit as claimed in claim 12, further comprising a protection circuit coupled between the second node and the first node, wherein the protection circuit comprises:
a first resistor comprising a first terminal coupled to the second node and a second terminal coupled to the first node;
a first capacitor comprising a first terminal coupled to the second node and a second terminal coupled to the first node;
a first diode comprising a first anode coupled to the second node and a first cathode; and
a second diode comprising a second anode coupled to the first node and a second cathode coupled to the first cathode.

15. The clamp circuit as claimed in claim 12, wherein the first detection circuit comprises:
a second capacitor comprising a first terminal coupled to the first major and a second terminal coupled to the second node; and
a second resistor comprising a first terminal coupled to the second node and a second terminal coupled to the first node,
wherein the first detection signal is generated at the second node.

16. The clamp circuit as claimed in claim 12, further comprising a protection circuit coupled between the second node and the first node, wherein the protection comprises:
a first diode comprising a first anode coupled to the second node and a first cathode;
a second diode comprising a second anode coupled to the first node and a second cathode coupled to the first cathode; and
an electrostatic discharge (ESD) protection circuit, coupled between the second node and the first node,
wherein in response to a first ESD event occurring at the second node or at the major drain, the ESD protection circuit provides a discharge path between the second node and the first node.

17. The clamp circuit as claimed in claim 16, wherein the ESD protection circuit comprises:
a second detection circuit coupled between the second node and the first node, wherein the second detection circuit detects whether the first ESD event occurs at the second node or at the major drain to generate a second detection signal; and
a discharge circuit receiving the second detection signal,
wherein in response to the second detection circuit detecting that the first ESD event occurs at the second node or at the major drain, the discharge circuit provides a discharge path between the second node and the first node according to the second detection signal.

18. The clamp circuit as claimed in claim 17, wherein the second detection circuit comprises:
a capacitor comprising a first terminal coupled to the second node and a second terminal coupled to a third node; and
a resistor comprising a first terminal coupled to the third node and a second terminal coupled to the first node.

19. The clamp circuit as claimed in claim 17, wherein the discharge circuit comprises:
a first transistor comprising a first gate coupled to the second detection circuit to receive the second detection signal, a first drain coupled to the second node, and a first source coupled to the first node, wherein in response to the second detection circuit detecting that the first ESD event occurs at the second node or at the major drain, the second detection circuit generates the second detection signal at the third node, and the transistor is turned on according to the second detection signal.

20. The clamp circuit as claimed in claim 19, wherein the first transistor is implemented by a GaN transistor.

\* \* \* \* \*